(12) United States Patent
Nanayakkara et al.

(10) Patent No.: US 12,297,537 B2
(45) Date of Patent: May 13, 2025

(54) COMPOUNDS AND METHODS FOR SELECTIVELY FORMING METAL-CONTAINING FILMS

(71) Applicant: MERCK PATENT GMBH, Darmstadt (DE)

(72) Inventors: Charith Nanayakkara, Haverhill, MA (US); Joby Eldo, Andover, MA (US); Jacob Woodruff, Lexington, MA (US); Charles Dezelah, Haverhill, MA (US); Shawn Sungeun Hong, Westford, MA (US); Ravindra Kanjolia, North Andover, MA (US); Daniel Moser, Sheboygan Falls, WI (US); Mark C. Potyen, Sheboygan Falls, WI (US)

(73) Assignee: MERCK PATENT GMBH, Darmstadt (DE)

( * ) Notice: Subject to any disclaimer, the term of this patent is extended or adjusted under 35 U.S.C. 154(b) by 276 days.

(21) Appl. No.: 17/776,788

(22) PCT Filed: Nov. 3, 2020

(86) PCT No.: PCT/EP2020/080785
§ 371 (c)(1),
(2) Date: May 13, 2022

(87) PCT Pub. No.: WO2021/099104
PCT Pub. Date: May 27, 2021

(65) Prior Publication Data
US 2022/0411930 A1    Dec. 29, 2022

Related U.S. Application Data

(60) Provisional application No. 62/938,011, filed on Nov. 20, 2019.

(51) Int. Cl.
*C23C 16/18* (2006.01)
*C23C 16/02* (2006.01)
*C23C 16/455* (2006.01)

(52) U.S. Cl.
CPC .... *C23C 16/45553* (2013.01); *C23C 16/0272* (2013.01); *C23C 16/18* (2013.01); *C23C 16/45534* (2013.01)

(58) Field of Classification Search
CPC ......... H01L 21/28562; C23C 16/45553; C23C 16/455525; C23C 16/18; C07C 333/16; B05D 2350/00; B22F 2201/00
See application file for complete search history.

(56) References Cited

U.S. PATENT DOCUMENTS 9,223,203 B2   12/2015   Farm et al.
10,378,105 B2   8/2019   Yu et al.
(Continued)

FOREIGN PATENT DOCUMENTS

GB    640158 A      7/1950
JP    2009516078 A  4/2009
JP    2017222928 A  12/2017

OTHER PUBLICATIONS

Jaakko Niinisto et al., Chem. Mater. 2007, 19, 3319-3324. (Year: 2007).*

(Continued)

*Primary Examiner* — Tabassom Tadayyon Eslami
(74) *Attorney, Agent, or Firm* — Harness Dickey & Pierce P.L.C.

(57) ABSTRACT

Compounds for selectively forming metal-containing films are provided. Methods of forming metal-containing films are also provided. The methods include forming a blocking layer, for example, on a first substrate surface, by a first deposition process and forming the metal-containing film, (Continued)

for example, on a second substrate surface, by a second deposition process.

46 Claims, 8 Drawing Sheets

(56) References Cited

U.S. PATENT DOCUMENTS

| | | | |
|---|---|---|---|
| 2017/0342553 | A1* | 11/2017 | Yu .................. H01L 21/3105 |
| 2018/0218914 | A1 | 8/2018 | Basu et al. |
| 2018/0233350 | A1 | 8/2018 | Tois et al. |
| 2019/0322812 | A1* | 10/2019 | Wojtecki .................. C08G 79/04 |

OTHER PUBLICATIONS

Halimehjani et al., Org. Lett., vol. 14, No. 15, 2012. (Year: 2012).*

2007 (Year: 2007).*

Office Action from Chinese Application No. 202080078782.4 dated Nov. 20, 2023.

Office Action from Chinese Applilcation No. 202080078782.4 dated Jul. 6, 2023.

International Search Report from PCT Application No. PCT/EP2020/080785 filed Feb. 18, 2021.

Written Opinion from PCT Application No. PCT/EP2020/080785 filed Feb. 18, 2021.

Ehsan, M.A., et al., "Synthesis and utilization of platinum(II) dialkyldithiocarbamate precursors in aerosol assisted chemical vapor deposition of platinum thin films as counter electrodes for dye-sensitized solar cells," Polyhedron, 166: 186-195 (2019).

Tao, Q., et al., "Selective atomic layer deposition of $HfO_2$ on copper patterned silicon substrates," Applied Physics Letters, 96(19): 192105 (2010).

Van Der Linden, J.G.M., et al., "Mixed Ligand Monothio- and Dithiocarbamato Complexes of Palladium(II)," Inorganica Chimica ACTA, 24: 261-267 (1977).

Halimehjani, A.Z., et al., "Investigation of the reaction of dithiocarbamic acid salts with trimethyl orthoformate and styrene epoxide," Tetrahedron Letters, 56(51): 7124-7127 (2015).

Office Action from corresponding Taiwan Application No. 109138234 dated Mar. 16, 2022.

Gowda, V., et al., "DFT calculations in the assignment of solid-state NMR and crystal structure elucidation of a lanthanum(III) complex with dithiocarbamate and phenanthroline," Dalton Trans., 45: 19473-19484 (2016).

Shaheen, F., et al., "Synthesis, characterization, antibacterial and cytotoxic activity of new palladium(II) complexes with dithiocarbamate ligands: X-ray structure of bis(dibenzyl-1-S:S'-dithiocarbamato) PD(II)," Journal of Organometallic Chemistry, 692: 3019-3026 (2007).

Chen, R., et al., "Investigation of Self-Assembled Monolayer Resists for Hafnium Dioxide Atomic Layer Deposition," Chem. Mater, 17: 536-544 (2005).

Lecordier, L., et al., "Vapor-deposited octadecanethiol masking layer on copper to enable area selective $Hf_3N_4$ atomic layer deposition on dielectrics studied by in situ spectroscopic ellipsometry," Journal of Vacuum Sciences & Technology, 36: 031605 (2018).

Hashemi, F.S.M., et al., "Selective Deposition of Dielectrics: Limits and Advantages of Alkanethiol Blocking Agents on Metal—Dielectric Patterns," ACS Appl. Mater. Interfaces, 8: 33264-33272 (2016).

Bobb-Semple, D., et al., "Area-Selective Atomic Layer Deposition Assisted by Self-Assembled Monolayers: A Comparison of Cu, Co, W, and Ru," Chem. Mater., 31: 1635-1645 (2019).

Wojtecki, R., et al., "Fifteen Nanometer Resolved Patterns in Selective Area Atomic Layer Deposition—Defectivity Reduction by Monolayer Design," ACS Appl. Mater. Interfaces., 10: 38630-38637 (2018).

Halimehjani, Azim Ziyaei, et al. "Investigation of the Reaction of Dithiocarbamic Acid Salts With Trimethyl Orthoformate and Styrene Epoxide." Tetrahedron Letters 56 (2015) pp. 7124-7127.

Office Action from JP Application No. 2022-529342 dated Jul. 9, 2024.

Office Action from Israeli Application No. 292918 dated Oct. 13, 2024.

Office Action from Korean Application No. 10 2022 7017993 dated Dec. 19, 2024.

Manuel A.V. et al. (1995). Standard enthalpies of formation of crystalline dimethylammoniumdimethyldithiocarbamate and of dimethyldithiocarbamate complexes of copper(II) and nickel(II). The mean Cu-S and Ni-S bond-dissociation enthalpies. The Journal of Chemical Thermodynamics, 27(2): 1365-1372.

Carbamodithioic acid, N,N-dimethyl-, compd. with N-methylmethanamine (1:1). CAS Registry No. 598-64-1. American Chemical Society (ACS). Retrieved Dec. 18, 2024.

Diethylammonium diethyldithiocarbamate. CAS Registry No. 1518-58-7. American Chemical Society (ACS). Retrieved Dec. 18, 2024.

Carbamodithioic acid, dicyclohexyl-, compd. with N-cyclohexylcyclohexanamine (1:1). CAS Registry No. 84805-86-7. American Chemical Society (ACS). Retrieved Dec. 18, 2024.

Carbamodithioic acid, N,N-dipentyl-, compd. with N-pentyl-1-pentanamine (1:1). CAS Registry No. 71902-20-0; American Chemical Society (ACS). Retrieved Dec. 18, 2024.

Carbamodithioic acid, cyclohexylethyl-, compd. with N-ethylcyclohexanamine (1:1). CAS Registry No. 13167-44-7. American Chemical Society (ACS). Retrieved Dec. 18, 2024.

Carbamodithioic acid, N ,N -dipropyl-, compd. with N -propyl-1-propanamine (1:1). CAS Registry No. 39234-20-3; American Chemical Society (ACS). Retrieved Dec. 18, 2024.

Carbamodithioic acid, N ,N -dibutyl-, compd. with N -butyl-1-butanamine (1:1). CAS Registry No. 2391-80-2; American Chemical Society (ACS). Retrieved Dec. 18, 2024.

1-Piperidinecarbodithioic acid, compd. with piperidine (1:1). CAS Registry No. 98-77-1; American Chemical Society (ACS). Retrieved Dec. 18, 2024.

Search Report from Singapore Application No. 11202203472T dated Feb. 5, 2025.

Written Opinion for Singapore Application No. 11202203472T dated Feb. 5, 2025.

* cited by examiner

Control

COMPOUNDS AND METHODS FOR SELECTIVELY FORMING METAL-CONTAINING FILMS

CROSS-REFERENCE TO RELATED PATENT APPLICATIONS

This application is a national stage application under 35 U.S.C. § 371 of International Application No. PCT/EP2020/080785, which has an international filing date of 3 Nov. 2020 and claims the benefit of U.S. Provisional Application No. 62/938,011 filed on 20 Nov. 2019. The contents of each application recited above are incorporated herein by reference in their entirety.

FIELD OF THE INVENTION

The present technology relates generally to compounds and deposition methods, particularly compounds and methods for selective metal-containing film growth on substrate surface.

BACKGROUND

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Metallic thin films and dielectric thin films are also used in microelectronics applications, such as the high-K dielectric oxide for dynamic random access memory (DRAM) applications and the ferroelectric perovskites used in infrared detectors and non-volatile ferroelectric random access memories (NV-FeRAMs).

Various precursors may be used to form metal-containing thin films and a variety of deposition techniques can be employed. Such techniques include reactive sputtering, ion-assisted deposition, sol-gel deposition, chemical vapor deposition (CVD) (also known as metalorganic CVD or MOCVD), and atomic layer deposition (ALD) (also known as atomic layer epitaxy). CVD and ALD processes are increasingly used as they have the advantages of enhanced compositional control, high film uniformity, and effective control of doping.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor is then passed over the substrate surface and reacts with the first precursor, forming a second monolayer of film over the first-formed monolayer of film on the substrate surface. This cycle is repeated to create a film of desired thickness.

However, with the continual decrease in the size of microelectronic components, such as semi-conductor devices, several technical challenges remain thereby increasing the need for improved thin film technologies. In particular, microelectronic components may include patterning, e.g., to form a conductive pathway or to form interconnections. Typically, patterning is achieved via etching and lithography techniques, but such techniques can be challenging as the demand for patterning complexity increases. Accordingly, there exists significant interest in the development of compounds and thin film deposition methods that can selectively grow a film on one or more substrates and achieve improved patterning on a substrate.

SUMMARY

According to one aspect, a compound for selectively forming metal-containing films is provided. The compound corresponds in structure to Formula I:

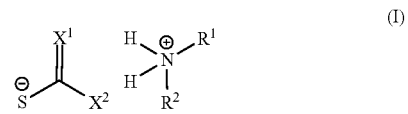

(I)

wherein $R^1$ and $R^2$ each independently can be a $C_1$-$C_{20}$-alkyl, each optionally substituted with one or more of a trifluoromethyl group, a hydroxyl group, a nitrile group, an alkoxy group, and an amino group. $X^1$ can be O or S and $X^2$ can be selected from the group consisting of $R^3$, $NR^4R^5$, —$SR^6$, and —$OR^7$, wherein $R^3$, $R^4$, $R^5$, $R^6$, and $R^7$ each independently can be a $C_1$-$C_{20}$-alkyl, each optionally substituted with one or more of a trifluoromethyl group, a hydroxyl group, a nitrile group, an alkoxy group, and an amino group.

According to another aspect, a method of forming a metal-containing film is provided. The method includes forming a blocking layer on a first substrate surface by a first deposition process and forming the metal-containing film on a second substrate surface by a second deposition process. The first deposition process includes vaporizing a compound corresponding in structure to Formula (I) as described herein. The second deposition process includes vaporizing at least one metal complex. The first substrate surface can include a metal material and the second substrate surface can include a dielectric material or a metal oxide.

According to another aspect, another method of forming a metal-containing film is provided. The method includes forming a blocking layer on a first portion of a substrate by a first deposition process and forming the metal-containing film on a second portion of the substrate by a second deposition process. The first deposition process includes exposing the substrate to a compound corresponding in structure to Formula (I) as described herein. The second deposition process includes exposing the substrate to at least one metal complex. The first portion of the substrate can include a metal material and the second portion of the substrate can include a dielectric material or a metal oxide.

According to another aspect another method of forming a metal-containing film is provided. The method includes forming a blocking layer on a first substrate surface by a first deposition process. The first deposition process includes vaporizing a compound corresponding in structure to Formula II:

(II)

wherein $X^3$ can be selected from the group consisting of $R^8$, $NR^9R^{10}$, $—SR^{11}$, and $—OR^{12}$. $R^8$, $R^9$, $R^{10}$, $R^{11}$, and $R^{12}$ each independently can be a $C_1$-$C_{20}$-alkyl, each optionally substituted with one or more of a trifluoromethyl group, a hydroxyl group, a nitrile group, an alkoxy group, and an amino group, and $X^4$ can be O or S. The method further includes forming the metal-containing film on a second substrate surface by a second deposition process. The second deposition process includes vaporizing at least one metal complex. The first substrate surface can include a metal material and the second substrate surface can include a dielectric material or a metal oxide.

According to another aspect, another method of forming a metal-containing film is provided. The method includes forming a blocking layer on a first portion of a substrate by a first deposition process. The first deposition process includes exposing the substrate to a compound corresponding in structure to Formula II:

(II)

wherein $X^3$ can be selected from the group consisting of $R^8$, $NR^9R^{10}$, $—SR^{11}$, and $—OR^{12}$. $R^8$, $R^9$, $R^{10}$, $R^{11}$, and $R^{12}$ each independently can be a $C_1$-$C_{20}$-alkyl, each optionally substituted with one or more of a trifluoromethyl group, a hydroxyl group, a nitrile group, an alkoxy group, and an amino group, and $X^4$ can be O or S. The method further includes forming the metal-containing film on a second portion of the substrate by a second deposition process. The second deposition process includes exposing the substrate to at least one metal complex. The first portion of the substrate can include a metal material and the second portion of the substrate can include a dielectric material or a metal oxide.

Other embodiments, including particular aspects of the embodiments summarized above, will be evident from the detailed description that follows.

DETAILED DESCRIPTION

Figure 1A:
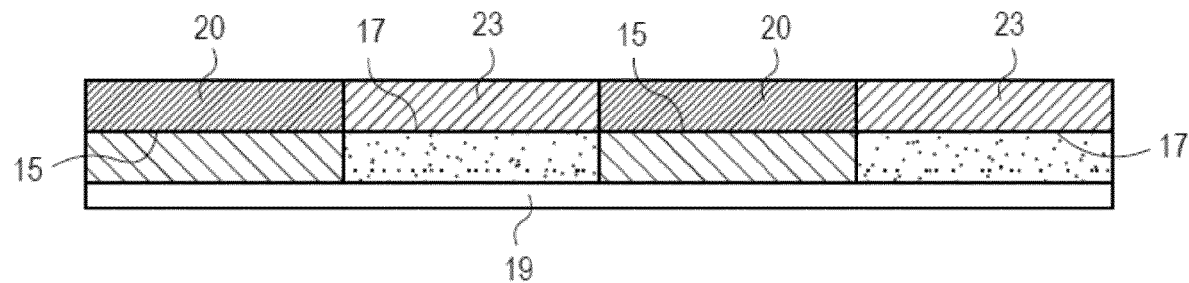
FIG. 1A illustrates details of a blocking layer and a metal-containing film according to certain aspects of the present disclosure.

Before describing several exemplary embodiments of the present technology, it is to be understood that the technology is not limited to the details of construction or process steps set forth in the following description. The present technology is capable of other embodiments and of being practiced or being carried out in various ways. It is also to be understood that the metal complexes and other chemical compounds may be illustrated herein using structural formulas which have a particular stereochemistry. These illustrations are intended as examples only and are not to be construed as limiting the disclosed structure to any particular stereochemistry. Rather, the illustrated structures are intended to encompass all such metal complexes and chemical compounds having the indicated chemical formula.

Applicant has discovered compounds and methods of performing deposition, which can selectively form a metal-containing film. In particular, the compounds and methods described herein can form a blocking layer on a first substrate surface or a first portion of a surface by a first deposition process and a metal-containing film on a second substrate surface or a second portion of the surface by a second deposition process. It was discovered that a blocking layer may deposited on metal-containing substrate, and this blocking layer can substantially block or inhibit growth of a metal-containing film on the blocking layer while allowing deposition of the metal-containing film on a dielectric material-containing substrate and/or a metal oxide-containing substrate. Advantageously, the methods described herein can allow for selective dielectric-on-dielectric deposition. Additionally, the methods described herein can allow for delivery of the blocking layer via a vapor phase method, which can use the same equipment utilized for delivery of the metal complex. Also, delivery of the blocking layer can be accomplished at a lower source temperature, for example, less than 150° C.

I. Definitions

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B", "A or B", "A", and "B".

The terms "substituent", "radical", "group", and "moiety" may be used interchangeably.

As used herein, the terms "metal-containing complex" (or more simply, "complex") and "precursor" are used interchangeably and refer to a metal-containing molecule or compound which can be used to prepare a metal-containing film, for example, by a vapor deposition process such as, for example, ALD or CVD. The metal-containing complex may be deposited on, adsorbed to, decomposed on, delivered to, and/or passed over a substrate or surface thereof, as to form a metal-containing film.

As used herein, the term "metal-containing film" includes not only an elemental metal film as more fully defined below, but also a film which includes a metal along with one or more elements, for example a metal oxide film, metal nitride film, metal silicide film, a metal carbide film and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

As used herein, the terms "selective growth," "selectively grown" and "selectively grows" may be used synonymously and refer to film growth on at least a portion of a second substrate surface (or second portion of a substrate) and substantially no film growth on a first substrate surface (or first portion of a substrate), on a blocking layer, or a combination thereof. The terms "selective growth," "selectively grown" and "selectively grows" also encompass more film growth on at least a portion of the second substrate surface (or second portion of the substrate) compared to film growth on a first substrate surface (or first portion of a substrate), on a blocking layer, or a combination thereof. With respect to more than one substrate, the terms "selective growth" "selectively grown" and "selectively grows" also encompass film growth on a first substrate and substantially no film growth on a second substrate (or a third substrate, or fourth substrate or a fifth substrate, etc.) as well as more film growth on the first substrate than on the second substrate (or a third substrate, or fourth substrate or a fifth substrate, etc.).

The term "alkyl" (alone or in combination with another term(s)) refers to a saturated hydrocarbon chain of 1 to about 25 carbon atoms in length, such as, but not limited to, methyl, ethyl, propyl, butyl, pentyl, hexyl, heptyl, octyl, decyl, and so forth. The alkyl group may be straight-chain or branched-chain. "Alkyl" is intended to embrace all structural isomeric forms of an alkyl group. For example, as used herein, propyl encompasses both n-propyl and isopropyl; butyl encompasses n-butyl, sec-butyl, isobutyl and tert-butyl; pentyl encompasses n-pentyl, tert-pentyl, neopentyl, isopentyl, sec-pentyl and 3-pentyl. Further, as used herein, "Me" refers to methyl, "Et" refers to ethyl, "Pr" refers to propyl, "i-Pr" refers to isopropyl, "Bu" refers to butyl, "t-Bu" refers to tert-butyl, and "Np" refers to neopentyl. In some embodiments, alkyl groups are $C_1$-$C_5$- or $C_1$-$C_4$-alkyl groups.

The term "alkoxy" refers to —O-alkyl containing from 1 to about 8 carbon atoms. The alkoxy may be straight-chain or branched-chain. Non-limiting examples include methoxy, ethoxy, propoxy, butoxy, isobutoxy, tert-butoxy, pentoxy and hexoxy.

The term "amino" herein refers to an optionally substituted monovalent nitrogen atom (i.e., —$NR^cR^d$, where $R^c$ and $R^d$ can be the same or different). For example, $R^c$ and $R^d$, each independently can be a $C_1$-$C_{10}$-alkyl. Examples of amino groups encompassed by the invention include, but are not limited to

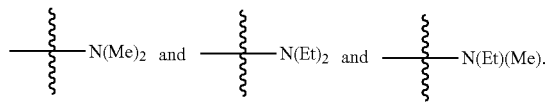

II. Compounds for Forming Blocking Layers

According to various aspects, a compound corresponding in structure to Formula I is provided:

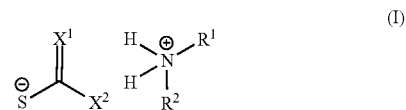

wherein $R^1$ and $R^2$ are each independently a $C_1$-$C_{20}$-alkyl, each optionally substituted with one or more of a trifluoromethyl group, a hydroxyl group, a nitrile group, an alkoxy group, and an amino group; $X^1$ is O or S; and $X^2$ is selected from the group consisting of $R^3$, $NR^4R^5$, —$SR^6$, and —$OR^7$; wherein $R^3$, $R^4$, $R^5$, $R^6$, and $R^7$ each independently can be a $C_1$-$C_{20}$-alkyl, each optionally substituted with one or more of a trifluoromethyl group, a hydroxyl group, a nitrile group, an alkoxy group, and an amino group.

In some embodiments, $X^2$ can be $R^3$, wherein $R^3$ can be a $C_1$-$C_{20}$-alkyl, optionally substituted with one or more of a trifluoromethyl group, a hydroxyl group, a nitrile group, an alkoxy group, and an amino group.

In some embodiments, $X^2$ can be $NR^4R^5$, wherein $R^4$ and $R^5$, can be each independently a $C_1$-$C_{20}$-alkyl, optionally substituted with one or more of a trifluoromethyl group, a hydroxyl group, a nitrile group, an alkoxy group, and an amino group.

In some embodiments, $X^2$ can be —$SR^6$, wherein $R^6$ can be a $C_1$-$C_{20}$-alkyl, optionally substituted with one or more of a trifluoromethyl group, a hydroxyl group, a nitrile group, an alkoxy group, and an amino group.

In some embodiments, $X^2$ can be —$OR^7$, wherein $R^7$ can be a $C_1$-$C_{20}$-alkyl, optionally substituted with one or more of a trifluoromethyl group, a hydroxyl group, a nitrile group, an alkoxy group, and an amino group.

In any embodiment as described above, $R^1$, $R^2$, $R^3$, $R^4$, $R^5$, $R^6$, and $R^7$ each independently can be a $C_1$-$C_{20}$-alkyl, a $C_1$-$C_{15}$-alkyl, a $C_1$-$C_{12}$-alkyl, a $C_1$-$C_{10}$-alkyl, a $C_1$-$C_8$-alkyl, a $C_1$-$C_4$-alkyl, or a $C_1$-$C_2$-alkyl, each optionally substituted with one or more of a trifluoromethyl group, a hydroxyl group, a nitrile group, an alkoxy group, and an amino group. In some embodiments, one or more (e.g., 2, 3, 4, 5, 6, or all) of $R^1$, $R^2$, $R^3$, $R^4$, $R^5$, $R^6$, and $R^7$ can be a methyl group. Additionally or alternatively, one or more (e.g., 2, 3, 4, 5, 6, or all) of $R^1$, $R^2$, $R^3$, $R^4$, $R^5$, $R^6$, and $R^7$ can be a dodecyl group The alkyl group may be straight-chained or branched. In particular, the alkyl is straight-chained.

In some embodiments, $X^1$ can be S and $X^2$ can be $NR^4R^5$, wherein $R^4$ can be a $C_1$-$C_{15}$-alkyl or a $C_1$-$C_{12}$-alkyl and $R^5$ can be a $C_1$-$C_4$-alkyl or a $C_1$-$C_2$-alkyl, wherein $R^4$ and $R^5$ each can be optionally substituted with one or more of a trifluoromethyl group, a hydroxyl group, a nitrile group, an alkoxy group, and an amino group. Additionally or alternatively, $R^1$ can be a $C_1$-$C_{15}$-alkyl or a $C_1$-$C_{12}$-alkyl and $R^2$ can be a $C_1$-$C_4$-alkyl or a $C_1$-$C_2$-alkyl, wherein $R^1$ and $R^2$ each can be optionally substituted with one or more of a trifluoromethyl group, a hydroxyl group, a nitrile group, an alkoxy group, and an amino group;

In any embodiment, a compound corresponding in structure to Formula (I) can be described as an adduct complex or a salt complex.

In some embodiments, the compound corresponding in structure to Formula (I) is N-dodecyl-N-methyl carbamodithioic acid N-dodecyl-N-methylammonium salt (Compound I).

III. Methods of Forming a Metal-Containing Film

Figure 1B:
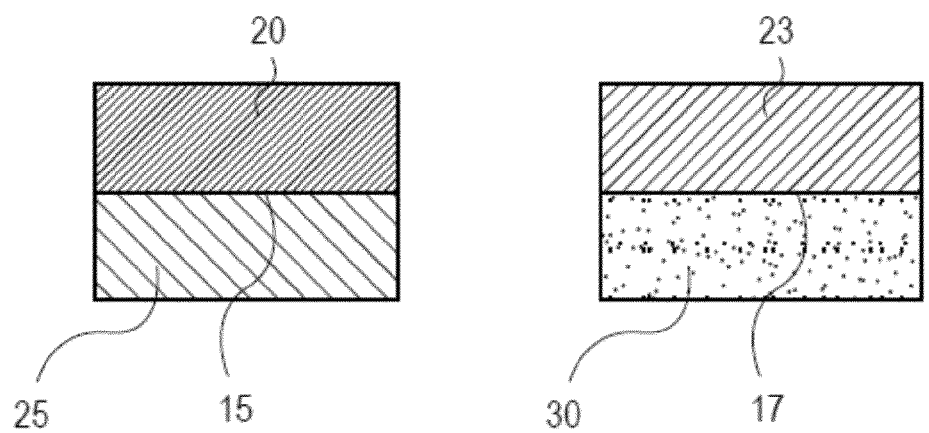
FIG. 1B illustrates details of a blocking layer and a metal-containing film according to certain alternate aspects of the present disclosure.

Methods of forming metal-containing films, for example, where the metal-containing film is selectively grown are provided herein. In various aspects, as illustrated in FIG. 1A, the method may include forming a blocking layer 20 on a first substrate surface 15 by a first deposition process. The method may further include forming a metal-containing film 23 on a second substrate surface 17 by a second deposition process. As shown in FIG. 1A the first substrate surface 15 and the second substrate surface 17 may be present on a single substrate 19, i.e., the same substrate. For example, when a single substrate 19 is used, the first substrate surface 15 can be considered a first portion 15 of substrate 19 and the second substrate surface 17 can be considered a second portion 17 of substrate 19. Alternatively, as illustrated in FIG. 1B, the first substrate surface 15 and the second substrate surface 17 may be present on different substrates, for example, a first substrate 25 and a second substrate 30, respectively.

The first substrate surface 15 (or first portion 15) can comprise a metal material. Examples of suitable metal materials include, but are not limited to tungsten (W), cobalt (Co), copper (Cu), and combinations thereof. In some embodiments, the metal material may comprise Co, Cu, or a combination thereof. In a particular embodiment, the metal material may comprise Cu. The second substrate surface 17 (or second portion 17) can comprise a dielectric material, a metal oxide material, or a combination thereof. The dielectric material can be a low-κ dielectric or a high-κ dielectric. Examples of suitable dielectric materials include, but are not limited to $SiO_2$, SiN, and a combination thereof. Examples of suitable metal oxide materials include, but are not limited to $HfO_2$, $ZrO_2$, $SiO_2$, $Al_2O_3$, and combinations thereof.

In any embodiment, the first deposition process may include exposing a substrate (e.g., first substrate surface 15, second substrate surface 17, substrate 19, first substrate 25, second substrate 30) to a compound corresponding in structure to Formula I as described herein and/or a compound of Formula II:

(II)

wherein $X^3$ can be selected from the group consisting of $R^8$, $NR^9R^{10}$, —$SR^{11}$, and —$OR^{12}$; wherein $R^8$, $R^9$, $R^{10}$, $R^{11}$, and $R^{12}$ can be each independently a $C_1$-$C_{20}$-alkyl, each optionally substituted with one or more of a trifluoromethyl group, a hydroxyl group, a nitrile group, an alkoxy group, and an amino group; and $X^4$ can be O or S.

In some embodiments, $X^3$ can be $R^8$, wherein $R^8$ can be a $C_1$-$C_{20}$-alkyl, optionally substituted with one or more of a trifluoromethyl group, a hydroxyl group, a nitrile group, an alkoxy group, and an amino group.

In some embodiments, $X^3$ can be $NR^9R^{10}$, wherein $R^9$ and $R^{10}$, can be each independently a $C_1$-$C_{20}$-alkyl, optionally substituted with one or more of a trifluoromethyl group, a hydroxyl group, a nitrile group, an alkoxy group, and an amino group.

In some embodiments, $X^3$ can be —$SR^{11}$, wherein $R^{11}$ can be a $C_1$-$C_{20}$-alkyl, optionally substituted with one or more of a trifluoromethyl group, a hydroxyl group, a nitrile group, an alkoxy group, and an amino group.

In some embodiments, $X^3$ can be —$OR^{12}$, wherein $R^{12}$ can be a $C_1$-$C_{20}$-alkyl, optionally substituted with one or more of a trifluoromethyl group, a hydroxyl group, a nitrile group, an alkoxy group, and an amino group.

In any embodiment as described above, $R^8$, $R^9$, $R^{10}$, $R^{11}$, and $R^{12}$ each independently can be a $C_1$-$C_{20}$-alkyl, a $C_1$-$C_{15}$-alkyl, a $C_1$-$C_{20}$-alkyl, a $C_1$-$C_8$-alkyl, a $C_1$-$C_4$-alkyl, or a $C_1$-$C_2$-alkyl, each optionally substituted with one or more of a trifluoromethyl group, a hydroxyl group, a nitrile group, an alkoxy group, and an amino group. In some embodiments, one or more (e.g., 2, 3, 4, or all) of $R^8$, $R^9$, $R^{10}$, $R^{11}$, and $R^{12}$ can be a methyl group. The alkyl group may be straight-chained or branched. In particular, the alkyl is straight-chained.

In some embodiments, $X^3$ can be $NR^9R^{10}$ and $X^4$ can be S, wherein $R^9$ can be a $C_1$-$C_4$-alkyl, or a $C_1$-$C_2$-alkyl and $R^{10}$ can be a $C_1$-$C_{15}$-alkyl or a $C_1$-$C_{12}$-alkyl, wherein $R^9$ and $R^{10}$ can be optionally substituted with one or more of a trifluoromethyl group, a hydroxyl group, a nitrile group, an alkoxy group, and an amino group.

In some embodiments, the compound corresponding in structure to Formula (II) is N-dodecyl-N-methyl carbamodithioic acid (Compound II).

In any embodiment, a compound corresponding in structure to Formula (I), a compound corresponding in structure to Formula (II), or both can be delivered or exposed to a substrate (e.g., first substrate surface 15, second substrate surface 17, substrate 19, first substrate 25, second substrate 30) at a lower temperature. For example, such temperature may be less than or equal to about 175° C., less than or equal to about 150° C., less than or equal to about 140° C., less than or equal to about 130° C., less than or equal to about 120° C., less than or equal to about 110° C., or about 100° C.; from about 100° C. to about 175° C., about 100° C. to about 150° C., or about 100° C. to about 130° C.

In any embodiment, the second deposition process may include exposing a substrate (e.g., first substrate surface 15, second substrate surface 17, substrate 19, first substrate 25, second substrate 30) to at least one metal complex.

The metal complex may include a suitable metal center with or more suitable ligands. Examples of a suitable metal center include, but are not limited to, titanium (Ti), zirconium (Zr) and hafnium (Hf). Examples of suitable ligands include but are not limited to, a $C_1$-$C_{10}$-alkyl group, a $C_1$-$C_{10}$-alkoxy group, a cyclopentadienyl group (Cp) optionally substituted with one or more $C_1$-$C_{10}$-alkyl group, and combinations thereof. For example, each ligand can independently be a methyl group, an ethyl group, a propyl group, a butyl group, methoxy group, an ethoxy group, a propoxy group, a butoxy group, a Cp group, a methyl substituted Cp (MeCp) group, an ethyl substituted Cp (EtCp) group, and combinations thereof.

In some embodiments, the metal complex can correspond in structure to Formula III:

(III)

wherein M can be Ti, Zr, or Hf, particularly Hf; and $L^1$, $L^2$, $L^3$, and $L^4$ each independently can be selected from the group consisting of a $C_1$-$C_8$-alkyl group, a $C_1$-$C_8$-alkoxy group, and Cp group optionally substituted with at least one $C_1$-$C_8$-alkyl. In some embodiments $L^1$, $L^2$, $L^3$, and $L^4$ can all be the same.

In some embodiments, M can be Hf and $L^1$, $L^2$, $L^3$, and $L^4$ each independently can be selected from the group consisting of a $C_1$-$C_4$-alkyl group, a $C_1$-$C_4$-alkoxy group, and Cp group optionally substituted with at least one $C_1$-$C_4$-alkyl.

In some embodiments, M can be Hf and $L^1$, $L^2$, $L^3$, and $L^4$ each independently can be selected from the group consisting of a $C_1$-$C_2$-alkyl group, a $C_1$-$C_2$-alkoxy group, and Cp group optionally substituted with at least one $C_1$-$C_2$-alkyl.

In some embodiments, the metal complex can be (MeCp)$_2$Hf(OMe)(Me).

Advantageously, the metal of the metal-containing film can be present in a substantially small amount on the blocking layer or substantially not present on the blocking layer. For example, the metal of the metal-containing film may be present on the blocking layer in amount of less than or equal to about 25 at. %, less than or equal to about 20 at. %, less than or equal to about 15 at. %, less than or equal to about 10 at. %, less than or equal to about 5 at. %, less than or equal to about 1 at. %, less than or equal to about 0.5 at. % or about 0 at. %; or from about 0 at. % to about 25 at. %, about 0.5 at. % to about 25 at. %, about 0.5 at. % to about 20 at. %, about 0.5 at. % to about 15 at. %, about 0.5 at. % to about 10 at. % or about 1 at. % to about 5 at. %.

Additionally or alternatively, the blocking layer may be present in a small amount or substantially not present on the second substrate surface (or second portion of the substrate with a 100:1 selectivity).

In any embodiment, the substrate may be exposed to a compound corresponding in structure to Formula (I), a compound corresponding in structure to Formula (II), a metal complex as described herein, or a combination thereof by any suitable deposition technique. For example, the first deposition process may comprise vaporizing a compound corresponding in structure to Formula (I), a compound corresponding in structure to Formula (II), or both. Alternatively, the substrate may be dipped or submerged into a solution comprising a compound corresponding in structure to Formula (I), a compound corresponding in structure to Formula (II), or both. Additionally or alternatively, the second deposition process may comprise vaporing at least one metal complex as described herein.

For example, this may include: (1) vaporizing a compound corresponding in structure to Formula (I), vaporizing a compound corresponding in structure to Formula (II), vaporizing at least one metal complex (e.g., corresponding in structure to Formula (III)), or a combination thereof; and (2) delivering a compound corresponding in structure to Formula (I), delivering a compound corresponding in structure to Formula (II), delivering at least one metal complex (e.g., corresponding in structure to Formula (III)), or a combination thereof to a substrate surface (e.g., first substrate surface 15, second substrate surface 17, substrate 19, first substrate 25, second substrate 30), or passing a compound corresponding in structure to Formula (I), passing a compound corresponding in structure to Formula (II), passing at least one metal complex (e.g., corresponding in structure to Formula (III)), or a combination thereof over a substrate (and/or decomposing a compound corresponding in structure to Formula I, decomposing a compound corresponding in structure to Formula (II), and/or decomposing at least one metal complex (e.g., corresponding in structure to Formula (III)), or a combination thereof on the substrate surface).

In any embodiment, the first deposition process and the second deposition process independently can be chemical vapor deposition (CVD) or atomic layer deposition (ALD).

The ALD and CVD methods encompass various types of ALD and CVD processes such as, but not limited to, continuous or pulsed injection processes, liquid injection processes, photo-assisted processes, plasma-assisted, and plasma-enhanced processes. For purposes of clarity, the methods of the present technology specifically include direct liquid injection processes. For example, in direct liquid injection CVD ("DLI-CVD"), a solid or liquid compound corresponding in structure to Formula (I), a solid or liquid compound corresponding in structure to Formula (II), a solid or liquid metal complex (e.g., corresponding in structure to Formula (III)), or a combination thereof may be dissolved in a suitable solvent and the solution formed therefrom injected into a vaporization chamber as a means to vaporize the compound corresponding in structure to Formula (I), the compound corresponding in structure to Formula (II), the metal complex (e.g., corresponding in structure to Formula (III)), or a combination thereof. The vaporized compound corresponding in structure to Formula (I), the vaporized compound corresponding in structure to Formula (II), the vaporized metal complex (e.g., corresponding in structure to Formula (III)), or a combination thereof is then transported/ delivered to the substrate surface. In general, DLI-CVD may be particularly useful in those instances where a metal complex displays relatively low volatility or is otherwise difficult to vaporize.

In one embodiment, conventional or pulsed CVD is used to form a metal-containing film by vaporizing and/or passing the at least one metal complex (e.g., corresponding in structure to Formula (III)) over a substrate surface. Additionally or alternatively, conventional or pulsed CVD is used to deliver a compound corresponding in structure to Formula (I), a compound corresponding in structure to Formula (II), or a combination thereof by vaporizing and/or passing the compound corresponding in structure to Formula (I), a compound corresponding in structure to Formula (II), or a combination thereof over a substrate surface. For conventional CVD processes see, for example Smith, Donald (1995). *Thin-Film Deposition: Principles and Practice*. McGraw-Hill.

In one embodiment, CVD growth conditions for the compound corresponding in structure to Formula (I), the compound corresponding in structure to Formula (II), the metal complex (e.g., corresponding in structure to Formula (III)), or a combination thereof include, but are not limited to:
  a) Substrate temperature: 50-600° C.
  b) Evaporator temperature (metal precursor temperature): 0-200° C.
  c) Reactor pressure: 0-100 Torr
  d) Argon or nitrogen carrier gas flow rate: 0-500 sccm
  e) Oxygen flow rate: 0-500 sccm
  f) Hydrogen flow rate: 0-500 sccm
  g) Run time: will vary according to desired film thickness In another embodiment, photo-assisted CVD is used to form a metal-containing film by vaporizing and/or passing at least one metal complex disclosed herein (e.g., corresponding in structure to Formula (III)) over a substrate surface. Additionally or alternatively, photo-assisted CVD is used to deliver a compound corresponding in structure to Formula (I), a compound corresponding in structure to Formula (II), or a combination thereof by vaporizing and/or passing the compound corresponding in structure to Formula (I), the compound corresponding in structure to Formula (II), or a combination thereof over a substrate surface.

In a further embodiment, conventional (i.e., pulsed injection) ALD is used to form a metal-containing film by vaporizing and/or passing at least one metal complex disclosed herein (e.g., corresponding in structure to Formula (III)) over a substrate surface. Additionally or alternatively, conventional (i.e., pulsed injection) ALD can be used to deliver a compound corresponding in structure to Formula (I), a compound corresponding in structure to Formula (II), or a combination thereof by vaporizing and/or passing the compound corresponding in structure to Formula (I), a compound corresponding in structure to Formula (II), or a combination thereof over a substrate surface. For conventional ALD processes see, for example, George S. M., et al. *J. Phys. Chem.*, 1996, 100, 13121-43131.

In another embodiment, liquid injection ALD is used to form a metal-containing film by vaporizing and/or passing at least one metal complex disclosed herein (e.g., corresponding in structure to Formula (III)) over a substrate surface, wherein at least one metal complex is delivered to the reaction chamber by direct liquid injection as opposed to vapor draw by a bubbler. Additionally or alternatively, liquid injection ALD is used to deliver a compound corresponding in structure to Formula (I), a compound corresponding in structure to Formula (II), or a combination thereof by vaporizing and/or passing the compound corresponding in structure to Formula (I), the compound corresponding in structure to Formula (II), or a combination thereof over a substrate surface, wherein the compound corresponding in structure to Formula (I), a compound corresponding in structure to Formula (II), or a combination thereof is delivered to the reaction chamber by direct liquid injection as opposed to vapor draw by a bubbler. For liquid injection ALD processes see, for example, Potter R. J., et al., *Chem. Vap. Deposition*, 2005, 11(3), 159-169.

Examples of ALD growth conditions for the compound corresponding in structure to Formula (I), the compound corresponding in structure to Formula (II), the metal complex (e.g., corresponding in structure to Formula (III)), or a combination thereof, include but are not limited to:
  a) Substrate temperature: 0-400° C.
  b) Evaporator temperature (metal precursor temperature): 0-200° C.
  c) Reactor pressure: 0-100 Torr
  d) Argon or nitrogen carrier gas flow rate: 0-500 sccm
  e) Reactive gas flow rate: 0-500 sccm
  f) Pulse sequence (metal complex/purge/reactive gas/purge): will vary according to the optimized process conditions and chamber size
  g) Number of cycles: will vary according to desired film thickness In another embodiment, photo-assisted ALD is used to form a metal-containing film by vaporizing and/or passing at least one metal complex disclosed herein (e.g., corresponding in structure to Formula (III)) over a substrate surface. Additionally or alternatively, photo-assisted ALD is used to deliver a compound corresponding in structure to Formula (I), a compound corresponding in structure to Formula (II), or a combination thereof by vaporizing and/or passing the compound corresponding in structure to Formula (I), a compound corresponding in structure to Formula (II), or a combination thereof over a substrate surface. For photo-assisted ALD processes see, for example, U.S. Pat. No. 4,581,249.

In another embodiment, plasma-assisted or plasma-enhanced ALD is used to form a metal-containing film by vaporizing and/or passing at least one metal complex disclosed herein (e.g., corresponding in structure to Formula (III)) over a substrate surface. Additionally or alternatively, plasma-assisted or plasma-enhanced ALD is used to deliver a compound corresponding in structure to Formula (I), a compound corresponding in structure to Formula (II), or a combination thereof by vaporizing and/or passing the compound corresponding in structure to Formula (I), a compound corresponding in structure to Formula (II), or a combination thereof over a substrate surface.

In another embodiment, a method of forming a metal-containing film on a substrate surface comprises: during an ALD process, exposing a substrate to a vapor phase metal complex according to one or more of the embodiments described herein (e.g., corresponding in structure to Formula (III)), such that a layer is formed on the surface comprising the metal complex bound to the surface by the metal center (e.g., hafnium); during an ALD process, exposing the substrate having bound metal complex with a co-reactant such that an exchange reaction occurs between the bound metal complex and co-reactant, thereby dissociating the bound metal complex and producing a first layer of elemental metal on the surface of the substrate; and sequentially repeating the ALD process and the treatment.

The reaction time, temperature and pressure are selected to create a metal-surface interaction and achieve a layer on the surface of the substrate. The reaction conditions for the ALD reaction will be selected based on the properties of the metal complex. The deposition can be carried out at atmospheric pressure but is more commonly carried out at a reduced pressure. The vapor pressure of the metal complex should be low enough to be practical in such applications. The substrate temperature should be low enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular metal complex used and the pressure. The properties of a specific metal complex for use in the ALD deposition methods disclosed herein can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

A metal complex for use in the deposition methods will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Thus, the metal complexes disclosed herein utilized in these methods may be liquid, solid, or gaseous. Typically, the metal complexes are liquids or solids at ambient temperatures with a vapor pressure sufficient to allow for consistent transport of the vapor to the process chamber.

In certain embodiments, the metal-containing complex (e.g., corresponding in structure to Formula (III)), a compound corresponding in structure to Formula (I), a compound corresponding in structure to Formula (II), or a combination thereof may be dissolved in a suitable solvent such as a hydrocarbon or an amine solvent to facilitate the vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyldodecylamine. For example, the metal-containing complex may be dissolved in toluene to yield a solution with a concentration from about 0.05 M to about 1 M.

In another embodiment, at least one metal complex (e.g., corresponding in structure to Formula (III)), a compound corresponding in structure to Formula (I), a compound corresponding in structure to Formula (II), or a combination thereof may be delivered "neat" (undiluted by a carrier gas) to a substrate surface.

In another embodiment, a mixed-metal film can be formed by the methods described herein which vaporizes at least a first metal complex as disclosed herein (e.g., corresponding in structure to Formula (III)), in combination, but not necessarily at the same time, with a second metal complex comprising a metal other than that of the first metal complex disclosed herein (and/or with a third metal complex and/or with a fourth metal complex and so on). For example, the first metal complex can comprise Hf and the second metal-containing complex can comprise Zr to form a mixed-metal, Hf—Zr film. In some embodiments, the mixed-metal film may be a mixed-metal oxide, a mixed-metal nitride, or a mixed-metal oxy-nitride.

In one embodiment, an elemental metal, a metal nitride, a metal oxide, or a metal silicide film can be formed by delivering for deposition at least one metal complex as disclosed herein (e.g., corresponding in structure to Formula (III)), independently or in combination with a co-reactant. In this regard, the co-reactant may be deposited or delivered to or passed over a substrate surface, independently or in combination with the at least one metal complex. As will be readily appreciated, the particular co-reactant used will determine the type of metal-containing film is obtained. Examples of such co-reactants include, but are not limited to hydrogen, hydrogen plasma, oxygen, air, water, an alcohol, $H_2O_2$, $N_2O$, ammonia, a hydrazine, a borane, a silane, ozone, or a combination of any two or more thereof. Examples of suitable alcohols include, without limitation, methanol, ethanol, propanol, isopropanol, tert-butanol, and the like. Examples of suitable boranes include, without limitation, hydridic (i.e., reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$), a hydrazine optionally substituted with one or more alkyl groups (i.e., an alkyl-substituted hydrazine) such as methylhydrazine, tert-butylhydrazine, N,N- or N,N'-dimethylhydrazine, a hydrazine optionally substituted with one or more aryl groups (i.e., an aryl-substituted hydrazine) such as phenylhydrazine, and the like.

In one embodiment, the metal complexes disclosed herein are delivered to the substrate surface in pulses alternating with pulses of an oxygen-containing co-reactant as to provide metal oxide films. Examples of such oxygen-containing co-reactants include, without limitation, $H_2O$, $H_2O_2$, $O_2$, ozone, air, i-PrOH, t-BuOH, or $N_2O$.

In other embodiments, a co-reactant comprises a reducing reagent such as hydrogen. In such embodiments, an elemental metal film is obtained. In particular embodiments, the elemental metal film consists of, or consists essentially of, pure metal. Such a pure metal film may contain more than about 80, 85, 90, 95, or 98% metal. In even more particular embodiments, the elemental metal film is a hafnium film.

In other embodiments, a co-reactant is used to form a metal nitride film by delivering for deposition at least one metal complex as disclosed herein (e.g., corresponding in structure to Formula (III)), independently or in combination, with a co-reactant such as, but not limited to, ammonia, a hydrazine, and/or other nitrogen-containing compounds (e.g., an amine) to a reaction chamber. A plurality of such co-reactants may be used. In further embodiments, the metal nitride film is a hafnium nitride film.

In a particular embodiment, the methods of the present technology are utilized for applications such as dynamic random access memory (DRAM) and complementary metal oxide semi-conductor (CMOS) for memory and logic applications, on substrates such as silicon chips.

Any of the metal complexes disclosed herein may be used to prepare thin films of the elemental metal, metal oxide, metal nitride, and/or metal silicide. Such films may find application as oxidation catalysts, anode materials (e.g., SOFC or LIB anodes), conducting layers, sensors, diffusion barriers/coatings, super- and non-superconducting materials/coatings, tribological coatings, and/or, protective coatings. It is understood by one of ordinary skill in the art that the film properties (e.g., conductivity) will depend on a number of factors, such as the metal(s) used for deposition, the presence or absence of co-reactants and/or co-complexes, the thickness of the film created, the parameters and substrate employed during growth and subsequent processing.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

EXAMPLES

Figure 2:
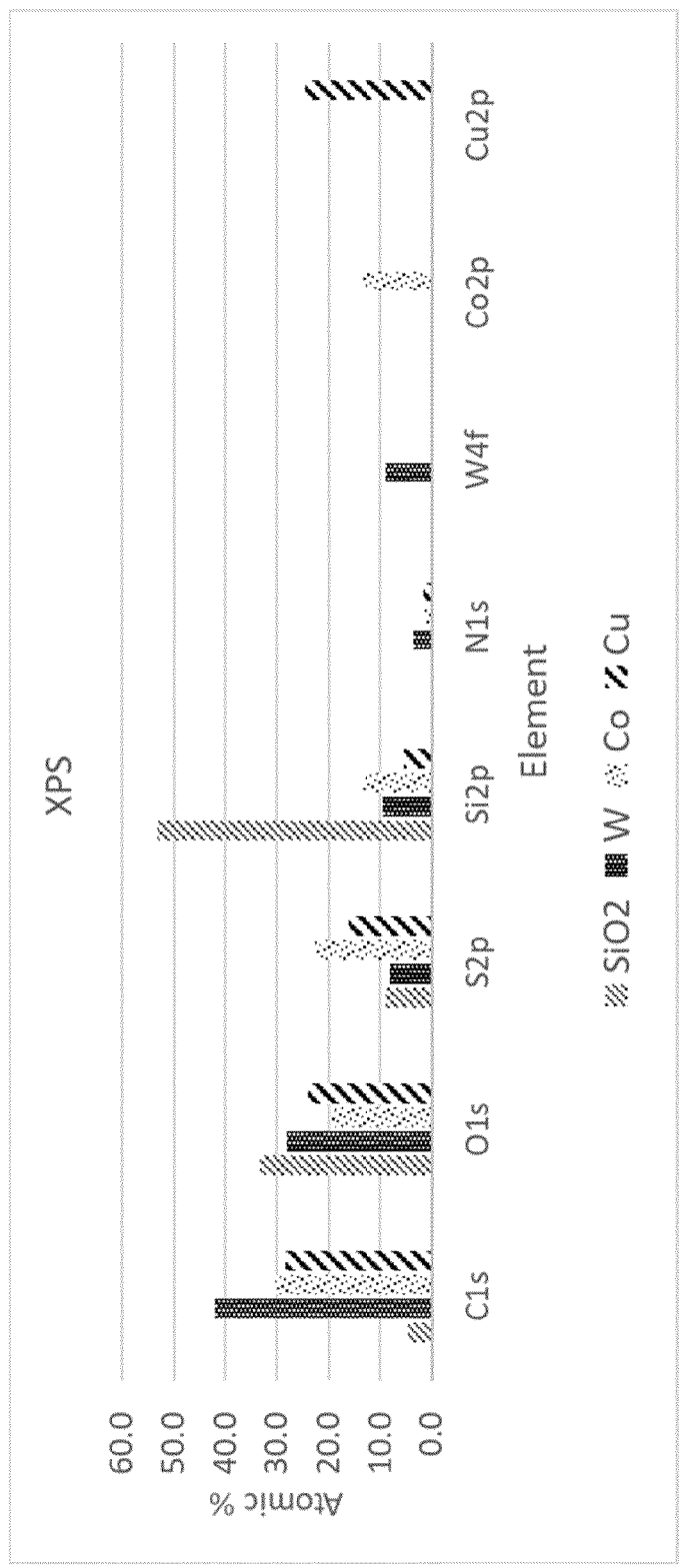
FIG. 2 illustrate X-ray photoelectron spectroscopy (XPS) analysis of $SiO_2$, W, Co, and Cu substrates after exposure to N-dodecyl-N-methyl carbamodithioic acid.

Example 1: Formation of Blocking Layers by Exposing Various Substrates to N-Dodecyl-N-Methyl Carbamodithioic Acid Blocking layers were prepared by a vapor phase delivery method using N-dodecyl-N-methyl carbamodithioic acid in a cross-flow atomic layer deposition (ALD) reactor. N-dodecyl-N-methyl carbamodithioic acid was kept in an ampoule at 130° C. A stainless steel cylinder kept at 150° C. connected the N-dodecyl-N-methyl carbamodithioic acid ampoule to the delivery manifold. First, the cylinder was filled with the N-dodecyl-N-methyl carbamodithioic acid vapor and then the N-dodecyl-N-methyl carbamodithioic acid vapor was pulsed for 60 seconds to the ALD chamber containing the following substrates: W, Co, Cu, and control $SiO_2$ on Si at 130° C. and trapped for 1 hour. X-ray photoelectron spectroscopy (XPS) analysis was performed on the substrates and confirmed N-dodecyl-N-methyl carbamodithioic acid grafting as a blocking layer on the substrates using S2p regions of XPS, as shown in FIG. 2.

Example 2: Blocking Layer Inhibition of Hafnium-Containing Films

Figure 3A:
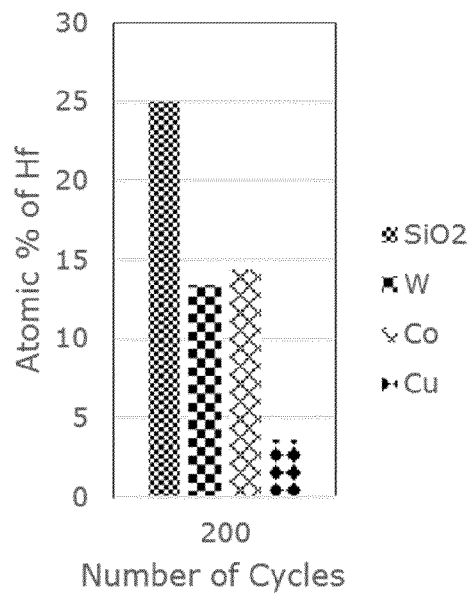
FIG. 3A illustrates atomic percentage of Hf present on $SiO_2$, W, Co, and Cu substrates after exposure to N-dodecyl-N-methyl carbamodithioic acid and $(MeCp)_2Hf(OMe)(Me)$.
Figure 3B:
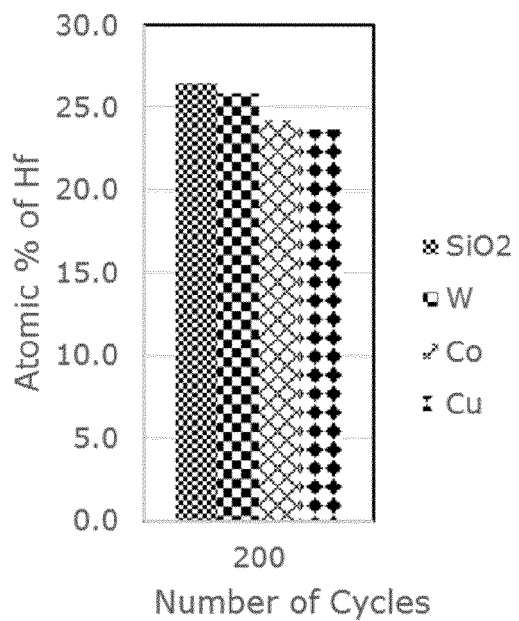
FIG. 3B illustrates atomic percentage of Hf present on $SiO_2$, W, Co, and Cu substrates after exposure to $(MeCp)_2Hf(OMe)(Me)$ without exposure to N-dodecyl-N-methyl carbamodithioic acid.
Figure 4A:
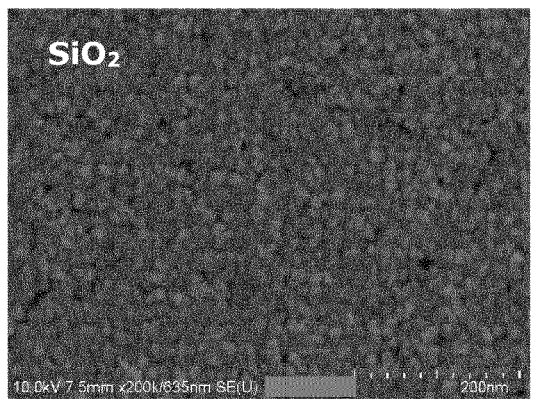
FIGS. 4A-4D provide scanning electron microscopy (SEM) images of $SiO_2$, W, Co, and Cu substrates, respectively, after exposure to N-dodecyl-N-methyl carbamodithioic acid and $(MeCp)_2Hf(OMe)(Me)$.
Figure 4B:
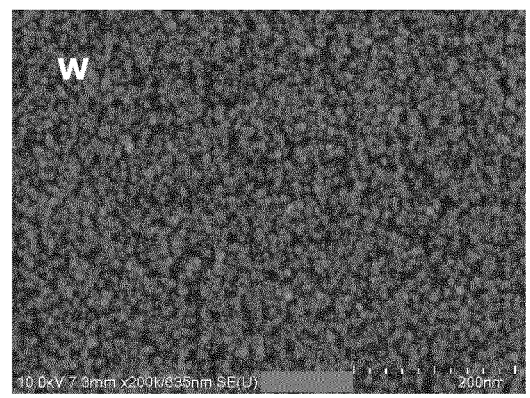
Figure 4C:
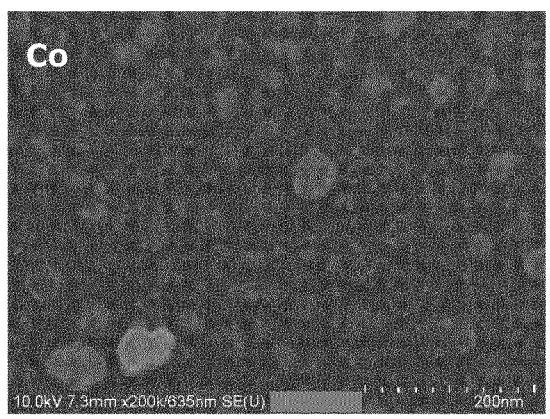
Figure 4D:

The ability of blocking layers formed by exposing W, Co, Cu, and control $SiO_2$ on Si substrates to N-dodecyl-N-methyl carbamodithioic acid to inhibit growth of Hf-containing films was tested. W, Co, Cu and control $SiO_2$ on Si substrates were exposed to N-dodecyl-N-methyl carbamodithioic acid as described above in Example 1 followed by 200 cycles of $(MeCp)_2Hf(OMe)(Me)$ and $H_2O$ at 350° C. Metal substrates were pre-cleaned with 2% citric acid for 1 minute before exposure to N-dodecyl-N-methyl carbamodithioic acid. $SiO_2$ samples were not pre-cleaned. For the control, W, Co, Cu and control $SiO_2$ on Si substrates were only exposed to $(MeCp)_2Hf(OMe)(Me)$. The conditions for the deposition were as follows: 2 seconds pulse Hf (from $(MeCp)_2Hf(OMe)(Me)$), 10 seconds pulse $N_2$ purge, 2 seconds pulse $H_2O$, and 10 seconds pulse $N_2$ purge. Atomic percentage of Hf was measured by XPS on $SiO_2$, W, Co, and Cu substrates after exposure to N-dodecyl-N-methyl carbamodithioic acid and $(MeCp)_2Hf(OMe)(Me)$, as shown in FIG. 3A. Atomic percentage of Hf was also measured by XPS on the control $SiO_2$, W, Co, and Cu substrates, which were not exposed to N-dodecyl-N-methyl carbamodithioic acid, but were exposed to $(MeCp)_2Hf(OMe)(Me)$, as shown in FIG. 3B. Scanning electron microscopy (SEM) images of $SiO_2$, W, Co, and Cu substrates, respectively, after exposure to N-dodecyl-N-methyl carbamodithioic acid and $(MeCp)_2Hf(OMe)(Me)$ are shown in FIGS. 4A-4D, respectively.

Example 3: Synthesis of N-Dodecyl-N-Methyl Carbamodithioic Acid N-Dodecyl-N-Methylammonium Salt (Compound I)

To a solution of N-dodecyl-N'-methyl amine (25 mmol) in methanol (50 mL), carbon disulfide (188 mmol) was added at 0° C. Then the reaction mixture was stirred at 0° C. for 2 hour and then overnight (8 to 12 hours) at room temperature (15° C. to 25° C.). Solvent was removed under nitrogen to give an off-white solid material (yield 87%). Crude product (off-white solid material) was purified by crystallization from methanol and characterized by $^1H$ Nuclear Magnetic Resonance ($^1H$ NMR), $^{13}C$ NMR, Thermogravimetric Analysis (TGA), Liquid Chromatography-Mass Spectrometry (LCMS), Elemental Analysis, Single Crystal X-Ray and Titration Analysis. The aforementioned characterization methods confirmed that Compound I exists as a complex/salt form as show below:

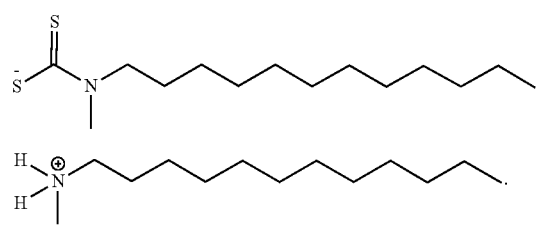

Figure 5A:
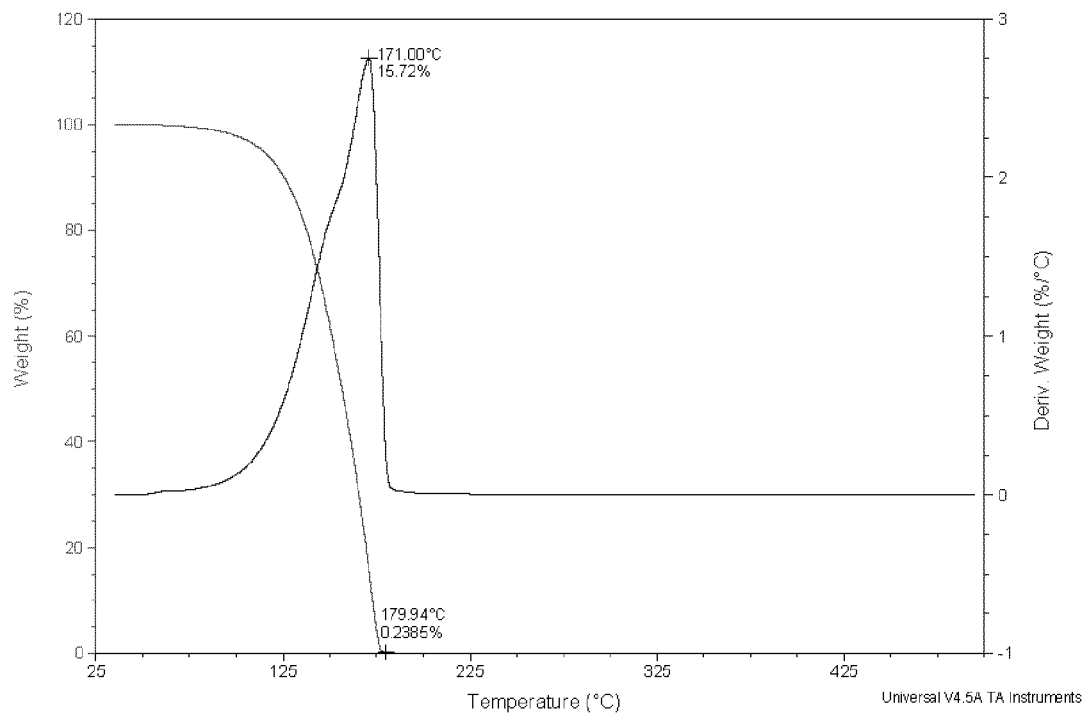
FIG. 5A is a graphical representation of thermal gravimetric analysis (TGA) data demonstrating % weight loss v. temperature of N-dodecyl-N-methyl carbamodithioic acid N-dodecyl-N-methylammonium salt (Compound I).
Figure 5B:
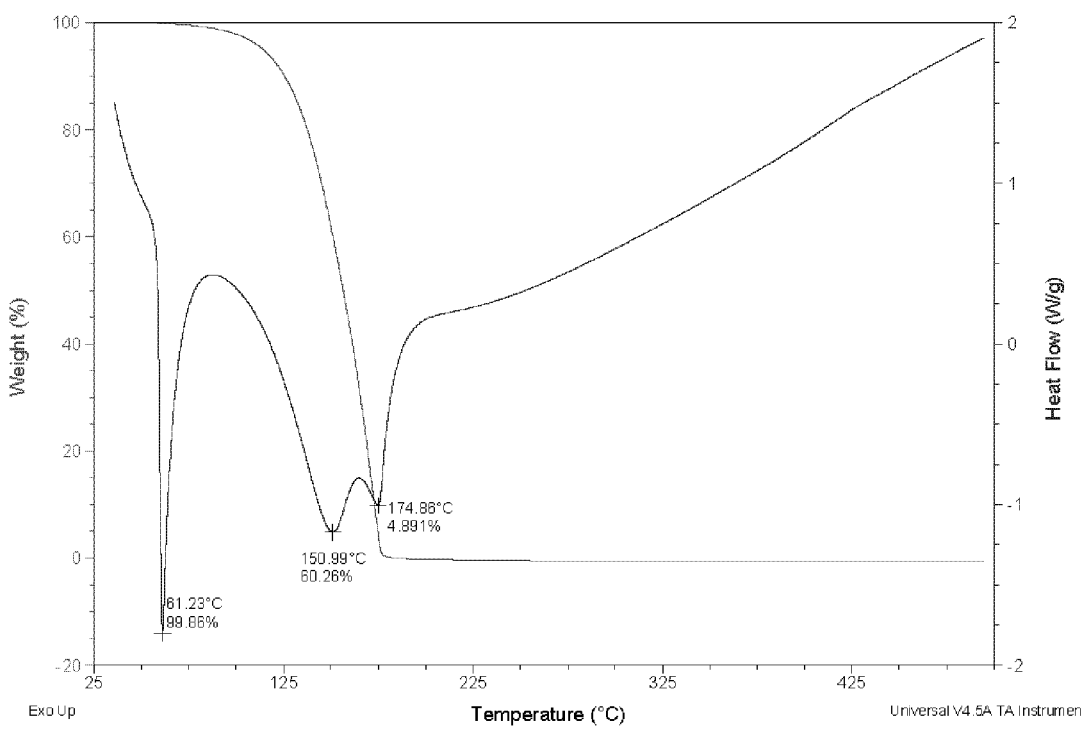
FIG. 5B is a graphical representation of differential scanning calorimetry (DSC) analysis of Compound I.

TGA was performed on Compound I (sample of 4.47 mg and heating rate of 10° C./min) and the results are provided in FIG. 5A. TGA showed melting at 61° C. and 0.2% residue a 180° C. and $T_{1/2}$=~171° C. Differential scanning calorimetry (DSC) was performed on Compound I and the results are provided in FIG. 5B.

Figures 6A, 6B:
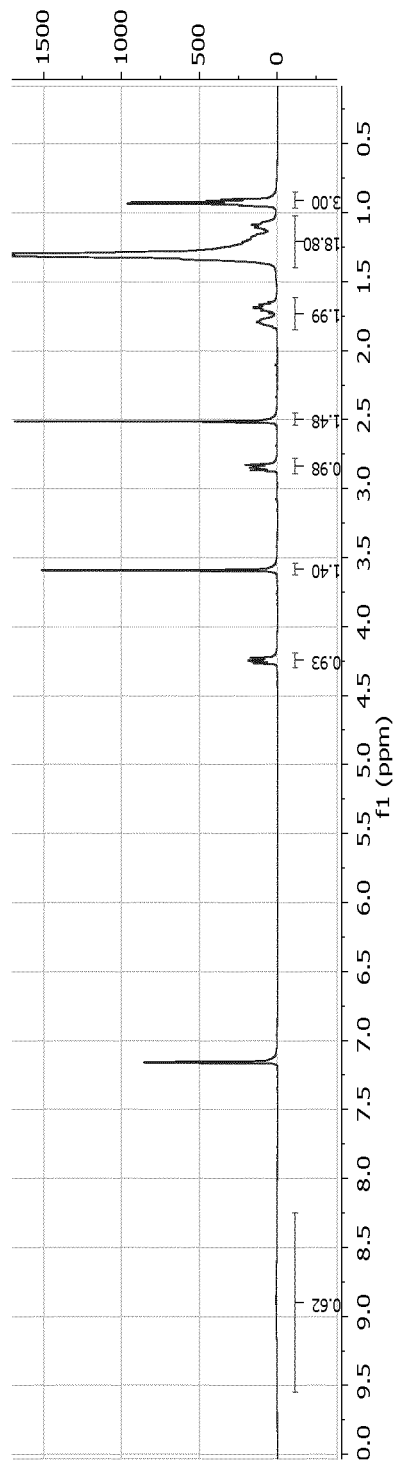
FIG. 6A illustrates a $^1H$ nuclear magnetic resonance ($^1H$ NMR) spectrum for Compound I.
FIG. 6B illustrates a $^{13}C$ NMR spectrum for Compound I.

$^1H$ NMR was performed on Compound I and the results are provided in FIG. 6A. $^{13}C$ NMR was performed on Compound I and the results are provided in FIG. 6B. $^1H$ NMR and $^{13}C$ NMR showed no free amine starting material.

Elemental analysis was determined for Compound I and the following observed: Carbon, 68.3%; Nitrogen, 5.8%; Sulfur, 13.4%.

Titration analysis was performed on Compound I and the results are shown below in Table 1.

TABLE 1

Titration Analysis

| Ratio | 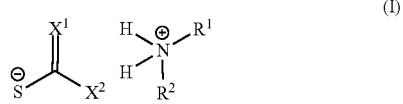 | 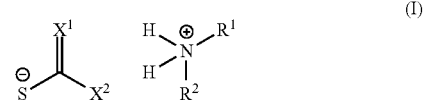 |
|---|---|---|
| Trial 1 | 52.2% | 47.7 % |
| Trial 2 | 49.8% | 51.2% |
| Trail 3 | 49.9% | 51.1% |
| Average | 50% | 50% |

Figure 7:
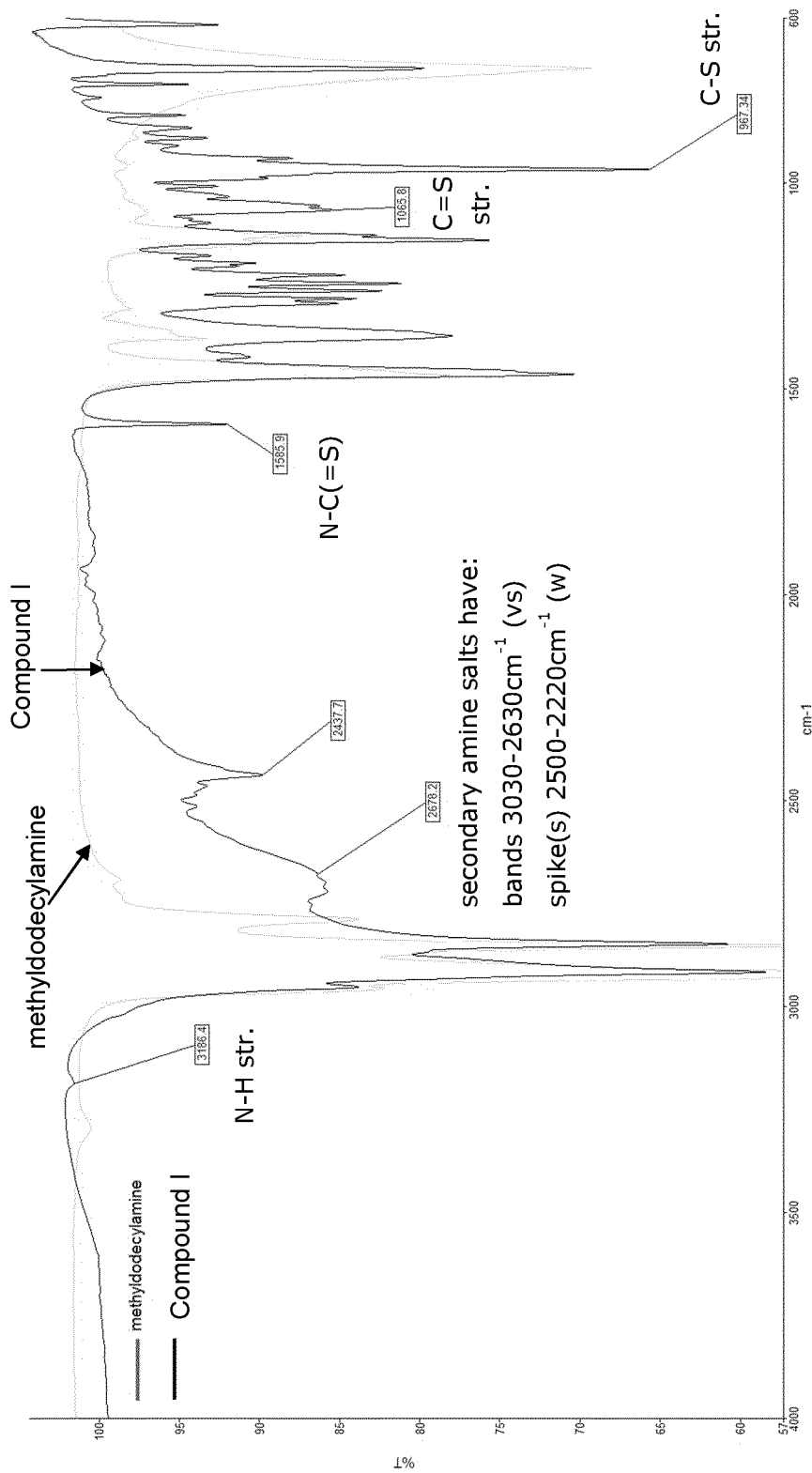
FIG. 7 illustrates an infrared (IR) spectrum for Compound I.
Figure 8:
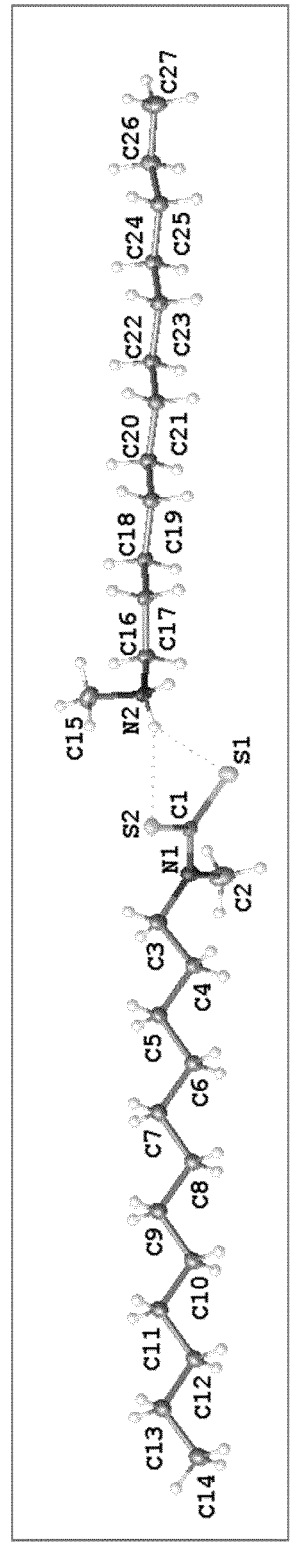
FIG. 8 illustrates the single crystal x-ray structure of Compound I.

Infrared (IR) spectroscopy was performed on Compound I and the results are shown in FIG. 7. Single crystal x-ray analysis was performed on Compound I and the results are shown in FIG. 8.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

What is claimed is:

1. A method of forming a metal-containing film, the method comprising:

forming a blocking layer on a first substrate surface by a first deposition process, the first deposition process comprising vaporizing a compound corresponding in structure to Formula I:

$$\underset{S}{\overset{X^1}{\underset{\ominus}{\bigcup}}}\underset{X^2}{\overset{}{\bigwedge}} \quad \underset{R^2}{\overset{H}{\underset{H}{\overset{\oplus}{N}}}} R^1 \quad (I)$$

wherein

R$^1$ and R$^2$ are each independently a $C_1$-$C_{20}$-alkyl, each optionally substituted with one or more of a trifluoromethyl group, a hydroxyl group, a nitrile group, an alkoxy group, and an amino group;

X$^1$ is O or S; and

X$^2$ is selected from the group consisting of R$^3$, NR$^4$R$^5$, —SR$^6$, and —OR$^7$, wherein R$^3$, R$^4$, R$^5$, R$^6$, and R$^7$ each independently are a $C_1$-$C_{20}$-alkyl, each optionally substituted with one or more of a trifluoromethyl group, a hydroxyl group, a nitrile group, an alkoxy group, and an amino group; and wherein at least one of R$^1$ and R$^4$ are dodecyl; and forming the metal-containing film on a second substrate surface by a second deposition process, the second deposition process comprising vaporizing at least one metal complex;

wherein the first substrate surface comprises a metal material and the second substrate surface comprises a dielectric material or a metal oxide.

2. The method of claim 1, wherein R$^1$, R$^2$, R$^3$, R$^4$, R$^5$, R$^6$, and R$^7$ are each independently a $C_1$-$C_{15}$-alkyl, each optionally substituted with one or more of a trifluoromethyl group, a hydroxyl group, a nitrile group, an alkoxy group, and an amino group.

3. The method of claim 1, wherein R$^1$, R$^2$, R$^3$, R$^4$, R$^5$, R$^6$, and R$^7$ are each independently a $C_1$-$C_{12}$-alkyl, each optionally substituted with one or more of a trifluoromethyl group, a hydroxyl group, a nitrile group, an alkoxy group, and an amino group.

4. The method of claim 1, wherein X$^2$ is NR$^4$R$^5$.

5. The method of claim 1, wherein R$^1$ is a $C_1$-$C_{15}$-alkyl, R$^2$ is $C_1$-$C_4$-alkyl, each optionally substituted with one or more of a trifluoromethyl group, a hydroxyl group, a nitrile group, an alkoxy group, and an amino group; X$^1$ is S; and X$^2$ is NR$^4$R$^5$, wherein R$^4$ is a $C_1$-$C_{15}$-alkyl, R$^5$ is $C_1$-$C_4$-alkyl, each optionally substituted with one or more of a trifluoromethyl group, a hydroxyl group, a nitrile group, an alkoxy group, and an amino group.

6. The method of claim 1, wherein the compound corresponding in structure to Formula (I) is N-dodecyl-N-methyl carbamodithioic acid N-dodecyl-N-methylammonium salt.

7. A method of forming a metal-containing film, the method comprising:

forming a blocking layer on a first portion of a substrate by a first deposition process, the first deposition process comprising exposing the substrate to a compound corresponding in structure to Formula I:

$$\underset{S}{\overset{X^1}{\underset{\ominus}{\bigcup}}}\underset{X^2}{\overset{}{\bigwedge}} \quad \underset{R^2}{\overset{H}{\underset{H}{\overset{\oplus}{N}}}} R^1 \quad (I)$$

wherein

R$^1$ and R$^2$ are each independently a $C_1$-$C_{20}$-alkyl, each optionally substituted with one or more of a trifluoromethyl group, a hydroxyl group, a nitrile group, an alkoxy group, and an amino group;

X$^1$ is O or S; and

X$^2$ is selected from the group consisting of R$^3$, NR$^4$R$^5$, —SR$^6$, and —OR$^7$, wherein R$^3$, R$^4$, R$^5$, R$^6$, and R$^7$ each independently are a $C_1$-$C_{20}$-alkyl, each optionally substituted with one or more of a trifluoromethyl group, a hydroxyl group, a nitrile group, an alkoxy group, and an amino group; and wherein at least one of R$^1$ and R$^4$ are dodecyl; and forming the metal-containing film on a second portion of the substrate by a second deposition process, the second deposition process comprising exposing the substrate to at least one metal complex;
wherein the first portion of the substrate comprises a metal material and the second portion of the substrate comprises a dielectric material or a metal oxide.

8. The method of claim 7, wherein $R^1$, $R^2$, $R^3$, $R^4$, $R^5$, $R^6$, and $R^7$ are each independently a $C_1$-$C_{15}$-alkyl, each optionally substituted with one or more of a trifluoromethyl group, a hydroxyl group, a nitrile group, an alkoxy group, and an amino group.

9. The method of claim 7, wherein $R^1$, $R^2$, $R^3$, $R^4$, $R^5$, $R^6$, and $R^7$ are each independently a $C_1$-$C_{12}$-alkyl, each optionally substituted with one or more of a trifluoromethyl group, a hydroxyl group, a nitrile group, an alkoxy group, and an amino group.

10. The method of claim 7, wherein $X^2$ is $NR^4R^5$.

11. The method of claim 7, wherein $R^1$ is a $C_1$-$C_{15}$-alkyl, $R^2$ is $C_1$-$C_4$-alkyl, each optionally substituted with one or more of a trifluoromethyl group, a hydroxyl group, a nitrile group, an alkoxy group, and an amino group; $X^1$ is S; and $X^2$ is $NR^4R^5$, wherein $R^4$ is a $C_1$-$C_{15}$-alkyl, $R^5$ is $C_1$-$C_4$-alkyl, each optionally substituted with one or more of a trifluoromethyl group, a hydroxyl group, a nitrile group, an alkoxy group, and an amino group.

12. The method of claim 7, wherein the compound corresponding in structure to Formula (I) is N-dodecyl-N-methyl carbamodithioic acid N-dodecyl-N-methylammonium salt.

13. A method of forming a metal-containing film, the method comprising:
forming a blocking layer on a first substrate surface by a first deposition process, the first deposition process comprising vaporizing a compound corresponding in structure to Formula II:

wherein
$X^3$ is selected from the group consisting of $R^8$, $NR^9R^{10}$, —$SR^{11}$, and —$OR^{12}$; wherein $R^8$, $R^9$, $R^{10}$, $R^{11}$, and $R^{12}$ are each independently a $C_1$-$C_{20}$-alkyl, each optionally substituted with one or more of a trifluoromethyl group, a hydroxyl group, a nitrile group, an alkoxy group, and an amino group; and
$X^4$ is O or S; and
forming the metal-containing film on a second substrate surface by a second deposition process, the second deposition process comprising vaporizing at least one metal complex;
wherein the first substrate surface comprises a metal material and the second substrate surface comprises a dielectric material or a metal oxide.

14. The method of claim 13, wherein $R^8$, $R^9$, $R^{10}$, $R^{11}$, and $R^{12}$ are each independently a $C_1$-$C_{15}$-alkyl, each optionally substituted with one or more of a trifluoromethyl group, a hydroxyl group, a nitrile group, an alkoxy group, and an amino group.

15. The method of claim 13, wherein $X^3$ is $R^8$ or $NR^9R^{10}$.

16. The method of claim 13, wherein $X^3$ is $NR^9R^{10}$, $X^4$ is S; $R^9$ is a $C_1$-$C_4$-alkyl and $R^{10}$ is a $C_1$-$C_{12}$-alkyl, each optionally substituted with one or more of a trifluoromethyl group, a hydroxyl group, a nitrile group, an alkoxy group, and an amino group.

17. The method of claim 13, wherein the compound corresponding in structure to Formula (II) is N-dodecyl-N-methyl carbamodithioic acid.

18. The method of claim 13, wherein $X^3$ is-$SR^{11}$ or —$OR^{12}$.

19. The method of claim 13, wherein the metal complex corresponds in structure to Formula III:

wherein M is Hf; and
$L^1$, $L^2$, $L^3$, and $L^4$ are each independently selected from the group consisting of a $C_1$-$C_8$-alkyl group, a $C_1$-$C_8$-alkoxy group, and a Cp group optionally substituted with at least one $C_1$-$C_8$-alkyl.

20. The method of claim 13, wherein the metal complex is $(MeCp)_2Hf(OMe)(Me)$.

21. The method of claim 13, wherein the metal of the metal-containing film is present in an amount of less than 15 at. % on the blocking layer.

22. The method of claim 13, wherein the first substrate surface and the second substrate surface are present on the same substrate.

23. The method of claim 13, wherein the metal material comprises W, Co, Cu or a combination thereof.

24. The method of claim 13, wherein the dielectric material comprises $SiO_2$, SiN, or a combination thereof, or the metal oxide material comprises $HfO_2$, $ZrO_2$, $SiO_2$, $Al_2O_3$, or a combination thereof.

25. The method of claim 13, wherein the compound corresponding in structure to Formula (II) is delivered at a temperature of less than 150° C.

26. The method of claim 13, wherein the second deposition process further comprises vaporizing at least one co-reactant selected from the group consisting of hydrogen, hydrogen plasma, oxygen, air, water, ammonia, a hydrazine, a borane, a silane, ozone, and a combination of any two or more thereof.

27. The method of claim 13, wherein the first substrate surface and the second substrate surface are present on different substrates.

28. The method of claim 13, wherein the first deposition process and the second deposition process are independently chemical vapor deposition or atomic layer deposition.

29. The method of claim 28, wherein the chemical vapor deposition is pulsed chemical vapor deposition, continuous flow chemical vapor deposition, or liquid injection chemical vapor deposition.

30. The method of claim 28, wherein the atomic layer deposition is liquid injection atomic layer deposition or plasma-enhanced atomic layer deposition.

31. A method of forming a metal-containing film, the method comprising:
forming a blocking layer on a first portion of a substrate by a first deposition process, the first deposition process comprising exposing the substrate to a compound corresponding in structure to Formula II:

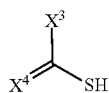

(II)

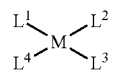

(III)

wherein
X³ is selected from the group consisting of R⁸, NR⁹R¹⁰, —SR¹¹, and —OR¹²; wherein R⁸, R⁹, R¹⁰, R¹¹, and R¹² are each independently a $C_1$-$C_{20}$-alkyl, each optionally substituted with one or more of a trifluoromethyl group, a hydroxyl group, a nitrile group, an alkoxy group, and an amino group; and X⁴ is O or S; and forming the metal-containing film on a second portion of the substrate by a second deposition process, the second deposition process comprising exposing the substrate to at least one metal complex;

wherein the first portion of the substrate comprises a metal material and the second portion of the substrate comprises a dielectric material or a metal oxide.

32. The method of claim 31, wherein R⁸, R⁹, R¹⁰, R¹¹, and R¹² are each independently a $C_1$-$C_{15}$-alkyl, each optionally substituted with one or more of a trifluoromethyl group, a hydroxyl group, a nitrile group, an alkoxy group, and an amino group.

33. The method of claim 31, wherein X³ is R⁸ or NR⁹R¹⁰.

34. The method of claim 31, wherein X³ is NR⁹R¹⁰; X⁴ is S; R⁹ is a $C_1$-$C_4$-alkyl and R¹⁰ is a $C_1$-$C_{12}$-alkyl, each optionally substituted with one or more of a trifluoromethyl group, a hydroxyl group, a nitrile group, an alkoxy group, and an amino group.

35. The method of claim 31, wherein the compound corresponding in structure to Formula (II) is N-dodecyl-N-methyl carbamodithioic acid.

36. The method of claim 31, wherein X³ is-SR¹¹ or —OR¹².

37. The method of claim 31, wherein the metal complex corresponds in structure to Formula III:

wherein M is Hf; and

L¹, L², L³, and L⁴ are each independently selected from the group consisting of a $C_1$-$C_8$-alkyl group, a $C_1$-$C_8$-alkoxy group, and a Cp group optionally substituted with at least one $C_1$-$C_8$-alkyl.

38. The method of claim 31, wherein the metal complex is (MeCp)₂Hf(OMe)(Me).

39. The method of claim 31, wherein the metal of the metal-containing film is present in an amount of less than 15 at. % on the blocking layer.

40. The method of claim 31, wherein the metal material comprises W, Co, Cu or a combination thereof.

41. The method of claim 31, wherein the dielectric material comprises $SiO_2$, SiN, or a combination thereof, or the metal oxide material comprises $HfO_2$, $ZrO_2$, $SiO_2$, $Al_2O_3$, or a combination thereof.

42. The method of claim 31, wherein the compound corresponding in structure to Formula (II) is delivered at a temperature of less than about 150° C.

43. The method of claim 31, wherein the second vapor deposition process further comprises vaporizing at least one co-reactant selected from the group consisting of hydrogen, hydrogen plasma, oxygen, air, water, ammonia, a hydrazine, a borane, a silane, ozone, and a combination of any two or more thereof.

44. The method of claim 31, wherein the first deposition process and the second deposition process are independently chemical vapor deposition or atomic layer deposition.

45. The method of claim 44, wherein the chemical vapor deposition is pulsed chemical vapor deposition, continuous flow chemical vapor deposition, or liquid injection chemical vapor deposition.

46. The method of claim 44, wherein the atomic layer deposition is liquid injection atomic layer deposition or plasma-enhanced atomic layer deposition.

* * * * *

UNITED STATES PATENT AND TRADEMARK OFFICE
CERTIFICATE OF CORRECTION

| | | |
|---|---|---|
| PATENT NO. | : 12,297,537 B2 | Page 1 of 1 |
| APPLICATION NO. | : 17/776788 | |
| DATED | : May 13, 2025 | |
| INVENTOR(S) | : Nanayakkara et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 301 days.

Signed and Sealed this
Seventh Day of October, 2025

John A. Squires
*Director of the United States Patent and Trademark Office*